United States Patent [19]
Leung et al.

[11] Patent Number: 5,719,573
[45] Date of Patent: Feb. 17, 1998

[54] ANALOG MODULATOR FOR A/D CONVERTER UTILIZING LEAP-FROG FILTER

[75] Inventors: Ka Yin Leung, Austin; Eric J. Swanson, Buda, both of Tex.

[73] Assignee: Cirrus Logic, Inc., Fremont, Calif.

[21] Appl. No.: 457,870

[22] Filed: Jun. 1, 1995

[51] Int. Cl.$^6$ ........................... H03M 3/00
[52] U.S. Cl. ............... 341/143; 341/118; 341/155
[58] Field of Search ........................ 341/143, 155, 341/118

[56] References Cited

U.S. PATENT DOCUMENTS

| | | | |
|---|---|---|---|
| 4,564,918 | 1/1986 | McNally et al. | 364/569 |
| 4,716,472 | 12/1987 | McNally | 360/8 |
| 4,748,578 | 5/1988 | Lagadec et al. | 364/724 |
| 4,772,871 | 9/1988 | Suzuki et al. | 341/155 |
| 4,780,892 | 10/1988 | Lagadec | 375/118 |
| 4,825,398 | 4/1989 | Koch et al. | 364/724.1 |
| 4,943,807 | 7/1990 | Early . | |
| 5,257,026 | 10/1993 | Thompson et al. . | |

OTHER PUBLICATIONS

M.S. Ghausi/K.R.Laker, "Modern Filter Design", 1981 by Bell Telephone Laboratories, Inc., pp. 342–357.
R.W.Adams/P.F. Ferguson,Jr./A.Fanesan/S. Vincelette/A. Volpe/R.Libert, "Theory and Practical Implemenation of a Fifth–Order Sigma–Delta A/D Converter", J. Audio Eng. .Soc., vol.39, No.7–8, 1991 Jul./Aug., pp. 515–527.
S.A.Jantzi/W.M.Snelgrove/P.F. Ferguson, Jr., "A Fourth–Order Bandpass Sigma–Delta Modulator", IEEE Journal of Solid–State Circuits, vol.28, No. 3, Mar. 1993, pp. 282–291.
R. Gregorian, G.C. Temes, "Analog MOS Integrated Circuits for Signal Processing", A Wiley–Interscience Publication, John Wiley & Sons, Copyright 1986, pp. 265–401.
Robert Adams and Tom Kwan, "Theory and VLSI Architectures for Asynchronous Sample–Rate Converters," J. Audio Eng. Soc., vol. 41, No. 7/8, Jul./Aug.
Robert Adams and Tom Kwan, "A Stereo Asynchronous Digital Sample–Rate Converter for Digital Audio," IEEE Journal of Solid–State Circuits, vol. 29, No. 4, Apr. 1994.
"Advance Information: DSP56ADC16 16–Bit Sigma–Delta Analog–to–Digital Converter," Motorola, Inc., 1989.
Lawrence R. Rabiner, Bernard Gold, "Theory and Application of Digital Signal Processing", pp. 328–329.
Charles D. Thompson, Salvador R. Bernadas, "A Digitally–Corrected 20b Delta–Sigma Modulator", 1994 IEEE International Solid–State Circuits Conference, pp. 194–195.

(List continued on next page.)

Primary Examiner—Jeffrey A. Gaffin
Assistant Examiner—Jason L. W. Kost
Attorney, Agent, or Firm—Gregory M. Howison; J. P. Violette

[57] ABSTRACT

An analog modulator is provided having seven switched-capacitor integrators (62)–(74) disposed in a leap-frog filter configuration with a plurality of feedback taps (76)–(88) provided from the output to each of the integrators (62)–(74). These are summed in a summation junction (90), the output thereof input to a quantizing circuit (92) for input back to a summation junction alter a D to A circuit (60) for summation with the analog input signal and then input to the first integrator (62). The first feedback structures (98)–(102) are provided for connection between the output of the last of the integrated structures (74) and the input of the preceding one thereof such that the feedback structure (98) is connected across integrators (64) and integrator (66), feedback structure (100) connected between integrators (68)–(70) and integrator (102) connected against integrators (72) and (74). Leap-frog feedback elements are connected across integrators (70) and (72) and leap-frog feedback filter (104) is connected across integrator (66) and (68).

18 Claims, 6 Drawing Sheets

OTHER PUBLICATIONS

Y.Matsuya, K.Uchimura, A.Iwata, T.Kobayashi, "A 16-bit Oversampling A-to-D Conversion Technology Using Triple-Integration Noise Shaping", IEEE Journal of Solid-State Cirucits, vol. SC-22, Dec. 1987, pp.921-928.

Mehdi Hatamiam and Keshab K. Parhi, "An 85-MHz Fourth-Order Programmable IIH Digital Filter Chip", IEEE Journal of Solid-State Circuits, vol. 27, No. 2, Feb. 1992, pp. 175-183.

David Vallancourt and Yannis P. Tsividis "A Fully Programmable Sampled-Data Analog CMOS Filter with Transfer-Function Coefficients Determined by Timing", IEEE Journal of Solid-State Circuits, vol. SC-22, No. 6, Dec. 1987, pp. 1022-1030.

Kin Lin and John Poulos, "Area Efficient Decimation Filter for an 18-bit Delta-Sigma Analog-to-Digital Convert", AES Feb. 1995, pp. 1-10.

Alan V. Oppenheim and Alan S. Willsky, "Signals and Systems", Analysis and Characterization of LTI Systems Using z-Transforms, Sec. 10.7, 1983.

David Vallancourt and Yannis P. Tsividis, "Timing-Controlled Fully Programmable Analog Signal Processors Using Switched Continuous-Time Filters", IEEE Transactions on Circuits and Systems, vol. 35, No. 8, Aug. 1988, pp. 947-954.

1994 Crystal Semiconductor Audio Databook, pp.3-143.

DSP56000/DSP56001 Digital Signal Processor User's Manual, Rev. 2, pp. 11-8 -11-9, 1990.

Texas Instruments TMS320C3x User's Guide, 1992, pp. 8-12 -8-16.

Andreas Antoniou, "Digital Filters", Second Edition, 1993, pp. 366-381.

ANALOG MODULATOR FOR A/D CONVERTER UTILIZING LEAP-FROG FILTER

TECHNICAL FIELD OF THE INVENTION

The present invention pertains in general to analog modulators for use in A/D converters and, more particularly, to a filtering technique for an analog modulator of a delta-sigma type wherein leap-frog filter techniques are utilized to minimize the sensitivity of the zeros in the noise frequency response.

BACKGROUND OF THE INVENTION

Analog modulators of the delta-sigma type typically utilize a switched-capacitor filter structure. Within the filter structure, a plurality of switched-capacitor integrators are arranged in series with the weighted output of each of the integrators fed through a feed forward device to a summing junction. Each of the feed forward devices has a weighting value, typically referred to as coefficients, these coefficients defining the poles of the noise frequency response. The output of the summing junction is then fed through a quantizing circuit back for summation to the input of the first integrator, which quantizer output is summed with an analog input. This quantizer output constitutes the digital output.

The poles of a typical analog delta-sigma analog modulator define the noise frequency response outside of the baseband of the analog modulator. Typically, the modulator is designed such that the noise rises outside the passband, this referred to as the out-of-band quantization noise. Thereafter, digital filtering techniques are utilized to remove this out-of-band noise. However, all of the zeroes of this type of modulator are disposed at DC. As such, the response of this type of modulator in the passband is not flat and, therefore, the noise will increase as the frequency increases to the corner frequency $f_b$ of the baseband.

In order to reduce baseband noise, feedback structures are utilized in the loop filter which provide feedback of a certain amount of energy from the output of one integrator to the input of another integrator. This feedback selectively disposes zeroes within the passband to effectively minimize the total in-band noise. Although this works quite well with low order filter structures, higher order filters are difficult to fabricate with these techniques due to the sensitivity of the filter to these zeroes in the modulator passband. This is due primarily to the fact that it is difficult to fabricate capacitors of exact values that are needed in high order filters. As such, zeroes will "move" around and cause the ripple in the passband to vary. It is desirable to have an equi-ripple passband response to attain optimal noise performance, and this requires zeroes to be accurately placed in the passband. When the zeroes vary, the noise at certain positions in the passband will increase, this being undesirable. Therefore, there is a need for utilizing higher order leap-frog filter structures within a delta-sigma analog modulator without requiring manufacturing techniques to realize the switched-capacitor filter structure needed for this type of modulator.

SUMMARY OF THE INVENTION

The present invention, disclosed and claimed herein, comprises an oversampled analog modulator. An analog modulator is comprised of a plurality of switched capacitor integrators connected in series. A plurality of switched-capacitor feedback structures are connected between the output of each of the integrators and a summing junction. The output of the summing junction is output to a quantization circuit to provide the digital output, and a digital-to-analog circuit to provide an analog signal for summation in a second summing junction with an analog input signal. This provides the input to the first of the integrators. At least one feedback structure is provided across two adjacent ones of the integrators. A second leap-frog filter structure is provided that is connected between the two of the switched-capacitor integrators and the preceding one of the switched-capacitor integrators.

In another aspect of the present invention, the primary feedback structures are utilized to define the zeroes in the passband of the noise frequency response of the analog modulator. Each of the feedback structures are connected across two adjacent ones of the switched-capacitor integrators, each of the feedback structures adjacent to each other. A plurality of leap-frog feedback structures are provided, having a number larger than the number of the primary feedback structures. Each of the leap-frog feedback structures has the output thereof connected between two adjacent ones of the switched-capacitor integrators having one of the primary feedback structures connected thereacross. The leap-frog feedback structures are connected in an adjacent configuration to each other. The leap-frog feedback structures desensitize the movement of the zeroes in the passband of the frequency response of the analog modulator.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figures 1, 9:
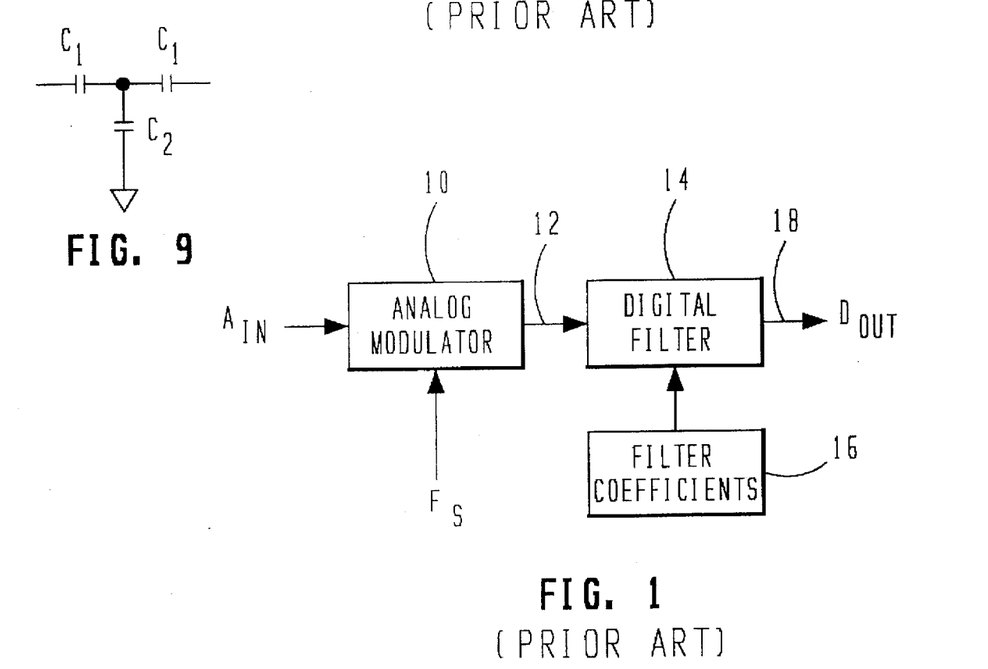
FIG. 1 illustrates an overall block diagram of an analog-digital converter.
FIG. 9 illustrates a preferred embodiment of the capacitor utilized to form the low value switched capacitors.

Referring now to FIG. 1, there is illustrated a block diagram of an analog-to-digital converter. The A/D converter is comprised of an analog modulator 10, which is operable to receive an analog input voltage $A_{in}$. The analog modulator 10 is then operable to process the analog input and then output a digital stream of values on a line 12. In the preferred embodiment, the analog modulator 10 is a delta-sigma modulator and the digital stream is a one-bit serial stream of digital values. The delta-sigma modulator is an oversampled modulator that operates on a sampling frequency $f_s$. As such, there is a certain amount of quantization noise that is associated with the modulation process. The structure of the delta-sigma modulator is configured such that this quantization noise is disposed outside of the passband. To remove the out-of-band quantization noise, a digital filter 14 is utilized. Digital filter 14 is of the finite impulse response (FIR) type if linear phase is desired. This type of filter requires a set of filter coefficients stored in a memory 16. The digital filter 14 then outputs parallel words on a digital output 18.

Figure 2:
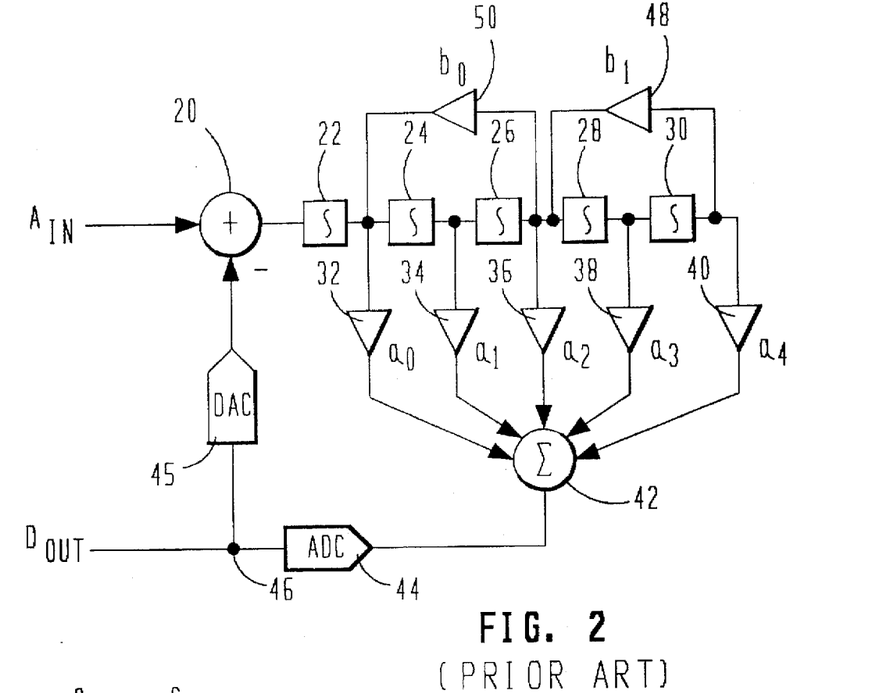
FIG. 2 illustrates a prior art filter structure for a delta-sigma analog modulator.

Referring now to FIG. 2, there is illustrated a prior art structure for an analog modulator. The analog input is input to a summing junction 20, the output thereof input to a first integrator 22. The output of the first integrator 22 is input to a second integrator 24, the output of the second integrator 24 is input to the input of a third integrator 26, the output of the third integrator 26 input to the input of a fourth integrator 28 and the output of the fourth integrator 28 input to the input of a fifth integrator 30. This is a fifth order modulator. The output of each of the integrators 22–30 is input to a respective feed forward block 32, 34, 36, 38 and 40. Coefficients associated with the feed forward blocks 32–40 are $a_0$, $a_1$, $a_2$, $a_3$ and $a_4$, respectively. The output of each of the feed forward blocks 32–40 are input to a summing block 42. The output of summing block 42 is input to a 1-bit A/D converter 44, which comprises a quantization circuit. The output of the quantization circuit 44 is input to a D/A circuit 45 and then input of the summing junction 20 and labeled with a "-".

The output of A/D 44 provides the 1-bit digital output stream for the analog modulator on a line 46.

In addition to the feed forward circuit, there are also provided for feedback circuitry. A first feedback circuit 48 is provided, connected between the output of integrator 30 and the input of integrator 28. Similarly, a second feedback circuit 50 is provided having the input thereof connected to the output of integrator 26 and the output thereof connected to the input of integrator 24. The coefficient for the feedback circuit 50 is $b_0$ and the coefficient associated with feedback circuit 48 is $b_1$.

Figure 3:
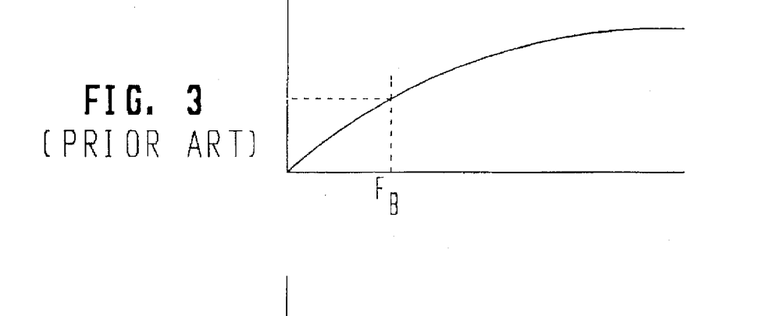
FIGS. 3 and 4 illustrate waveform plots for a non-feedback configuration and feedback configuration, respectively.
Figure 4:
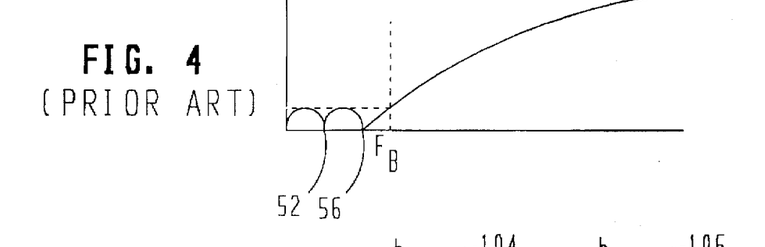

Referring now to FIG. 3, there is illustrated a frequency plot for the prior art structure of FIG. 2, without the feedback circuits 48 and 50. The frequency plot can be seen to provide an increasing noise level within the passband, the upper edge of the passband labeled with the corner frequency $f_b$. This is the baseband corner frequency. FIG. 4 illustrates the frequency plot for the prior art structure of FIG. 2 with the feedback blocks 48 and 50. These provide two zeroes 52 and 56. It can be seen that by utilizing the feedback blocks 48 and 50, the noise within the passband is decreased.

Figure 5:
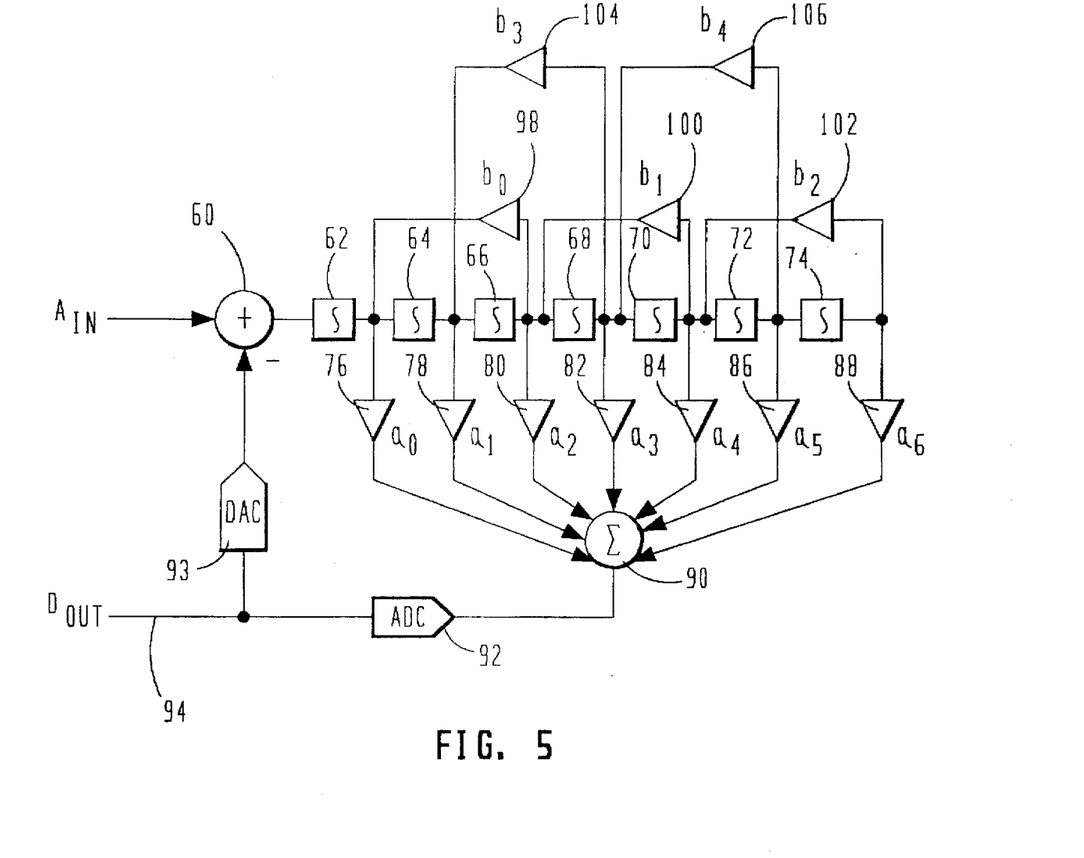
FIG. 5 illustrates a block diagram of the leap-frog filter structure of the present invention for the delta-sigma modulator.

Referring now to FIG. 5, there is illustrated a block diagram of the analog modulator of the present invention. The analog input signal is input to a summing junction 60, the output thereof input to a first integrator 62. This is a seventh order modulator, and therefore, comprises six additional integrator sections 64, 66, 68, 70, 72 and 74 arranged in a linear fashion with the output of one connected to the input of the other and the output of integrator 62 connected to the input of integrator 64. Each of the integrators 62–74 has connected to the output thereof a feed forward block 76, 78, 80, 82, 84, 86 or 88, respectively. The coefficients associated with the feed forward blocks 76–88 are $a_0$, $a_1$, $a_2$, $a_3$, $a_4$, $a_5$ and $a_6$, respectively.

The output of the each of the feed forward blocks 76–88 are connected to the input of a summing block 90. The output of the summing block 90 is input in the input of an A/D converter 92, which A/D converter is a quantizer. In one embodiment, the quantizer is a 1-bit quantizer, which is essentially a comparator. As such, the output would be a 1-bit output. Since this is an oversampled structure using switched-capacitor integrators, this can be realized in a conventional manner. However, it should be understood that a multi-bit output quantizer circuit 92 could be utilized. The output of the quantizer 92 provides the digital output of the analog modulator on a line 94 and also is processed through a D/A converter 93 to provide the feedback to the summing junction 60 labeled "-".

In addition to the feed forward blocks 76–88, there are provided three feedback blocks 98, 100 and 102. Feedback block 98 is connected between the output of integrator 66 and the input of integrator 64, feedback block 100 is connected between the output of integrator 70 and the input of integrator block 68 and feedback block 102 is connected between the output of integrator block 74 and the input of integrator block 72. The coefficients associated with feedback blocks 98–102 are $b_0$, $b_1$ and $b_2$, respectively. In addition to the conventional feedback blocks 98, 100 and 102, there are provided two "leap-frog" feedback blocks 104 and 106. The feedback block 104 is connected to any output of the integrator block 68 and the input to the integrator block 66 and the feedback block 106 is connected between the output of integrator block 72 and the input of integrator block 70. The coefficients for the integrator blocks 104 and 106 are labeled $b_3$ and $b_4$, respectively.

Figure 6:
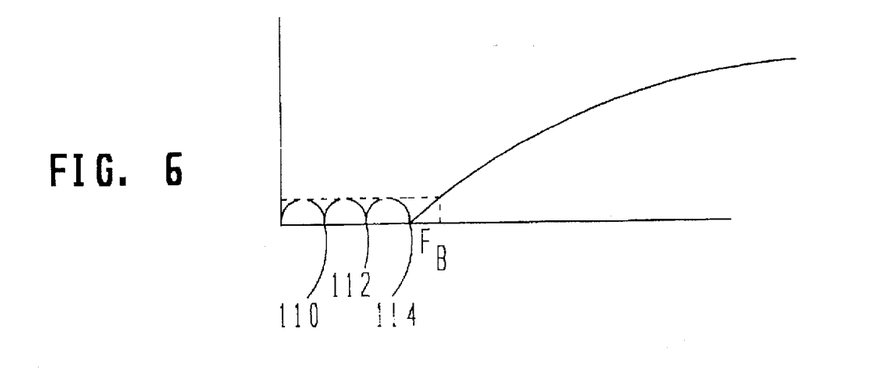
FIG. 6 illustrates a frequency plot for the response of the modulator of FIG. 5.
Figure 6A:
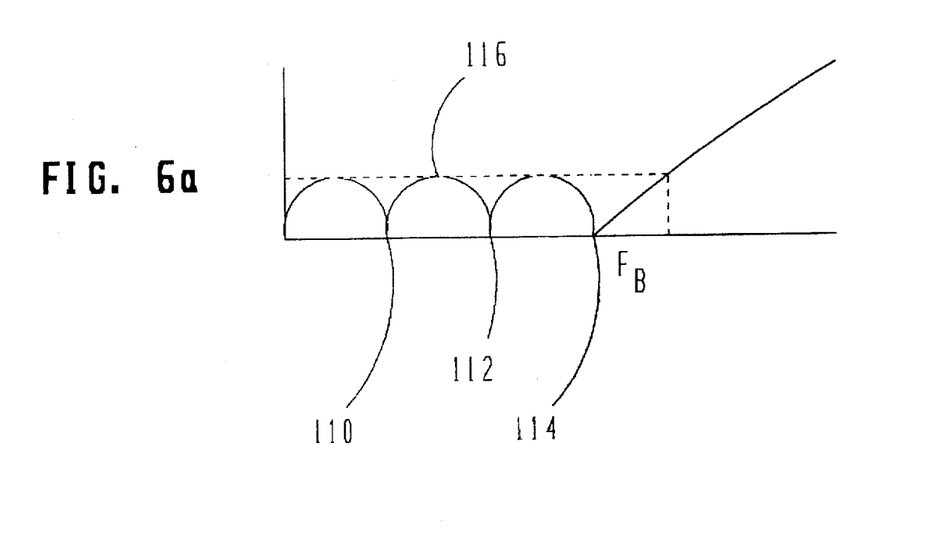
FIG. 6a illustrates a detail of the frequency plot of FIG. 6.
Figure 6B:
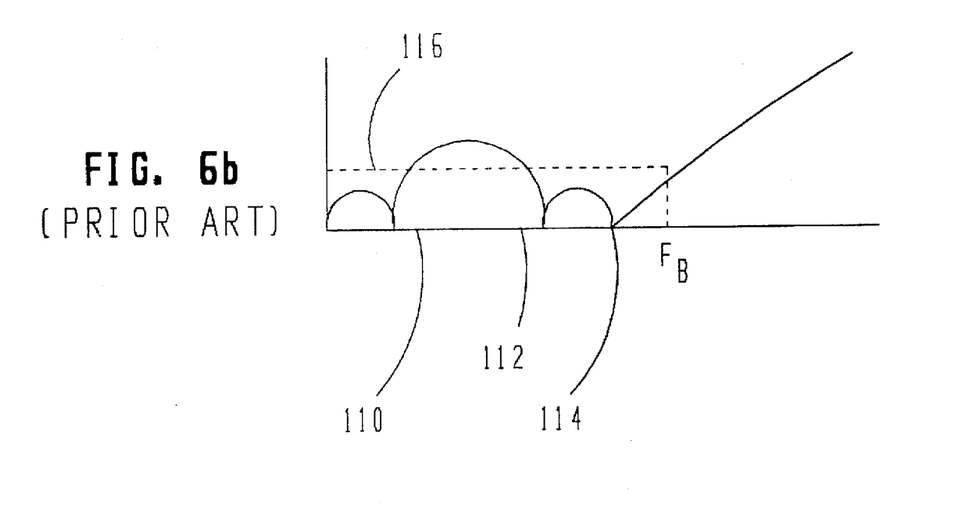
FIG. 6b illustrates a plot of a prior art response without the feedback structure of the present invention.

Referring now to FIG. 6, there is illustrated a frequency plot for the response of the analog modulator of FIG. 5. It can be seen that the three feedback blocks 98–102 provide for three zeroes 110, 112 and 114. A detailed illustration of the passband portion of this is illustrated in FIG. 6a. The zeroes 110–114 are originally designed in the ideal filter to be equally spaced from each other. In this manner, the peak of each of the ripples in the baseband response is kept below a level 116. In addition, this level 116 is the level below which all noise exists within the baseband. However, if the leap-frog feedback blocks 104 and 106 are not utilized and the zeroes are allowed to move due to manufacturing tolerances, the frequency response of FIG. 6b can result. In the frequency response of FIG. 6b, there are illustrated three corresponding zeroes 110', 112' and 114'. It can be seen that the distances between the zeroes 110' and 112' has increased, thus increasing the level of the noise between those two zeroes to a level above the optimum noise level 116. This is not an equi-ripple design. The reason for this is that the zeroes 110' and 112' have moved.

The zeroes 110, 112 and 114 are a function of the coefficients $b_0$, $b_1$ and $b_2$. The first zero 110 is a function of $b_0$, the second zero 112 is a function of $b_1$ and the third zero 114 is a function of $b_2$. In addition, the first zero 110 is also a function of $b_3$, the second zero 112 is also a function of $b_3$ and $b_4$ and the third zero 114 is also a function of $b_4$. Therefore, it can be seen that the coefficients of $b_3$ and $b_4$ will modify the sensitivity of the zeroes 110, 112 and 114. Although this modification of sensitivities is well-known with respect to leap-flog filters and the poles thereof, this has been utilized in all pole-filters and has not been utilized with zeroes in an oversampled analog modulator utilizing a quantization device in the feedback.

Figure 7:
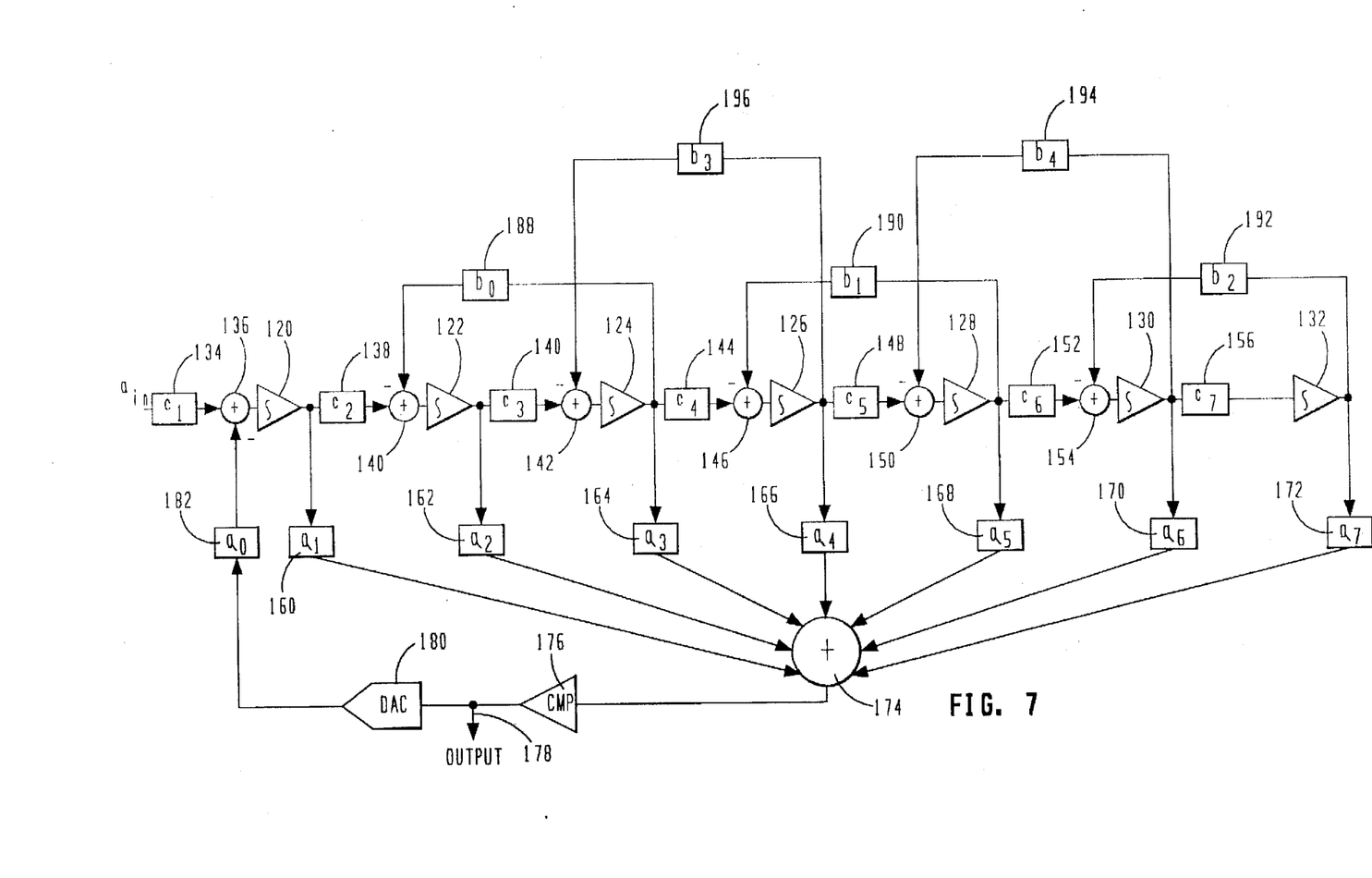
FIG. 7 illustrates a block diagram of the modulator depicting the coefficients.

Referring now to FIG. 7, there is illustrated block diagram of the modulator depicting the coefficients. The coefficients, as is well-understood in the art, are comprised of a ratio of various capacitors in a switched-capacitor configuration. As described above, the modulator is a seventh order modulator utilizing seven integrators, integrators 120, 122, 124, 126, 128, 130 and 132, connected in series. The input is input through a coefficient block 134 with a coefficient of 0.162, this input to a summing junction 136. The output of the summing junction 136 is input to the integrator 120, the output therefore input to a coefficient block 138, with a coefficient of 0.318. The output of the coefficient block 138 is input to the summing junction 140, the output thereof input to the integrator 122, the output of integrator 122 input to a coefficient block 140, with a coefficient of 0.1285. Coefficient block 140 is input to a summing junction 142, the output thereof connected to the input of integrator 124. The output of integrator 124 is input to a coefficient block 144, with a coefficient of 0.171, the output thereof input to a summing junction 146. Summing junction 146 is input to an integrator 126, the output of integrator 126 input to a coefficient block 148, with the coefficient of 0.215. The coefficient block 148 is input to a summing junction 150, the output thereof connected to the input of integrator 128. Integrator 128 is input to a coefficient block 152 with a coefficient of 0.144. Coefficient block 152 is input to a summing junction 154, the output thereof input to the integrator 130. The output of integrator 130 is input to a coefficient block 156, with the coefficient of 0.059. Coefficient block 156 is input to the integrator 132.

Each of the outputs of the integrators 120–132 is input through a respective coefficient block 160, 162, 164, 166, 168, 170 and 172. The coefficients are respectively 0.3, 0.4, 0.8, 0.8, 0.4, 0.2 and 0.1. These coefficient blocks 160–172 are all input to a master summing block 174, the output thereof input to a comparator 176. The comparator 176 provides on the output thereof a digital output line 178. This is also input to the input of a digital-to-analog converter (DAC) 180. The input also provides a quantized output for the modulator. The output of the DAC 180 is input to a coefficient block 182, with a coefficient of 0.09. The output of coefficient block 182 is input to the other input of the summing junction 136.

Feedback loops are provided which are represented by coefficient blocks. The first feedback loop is provided between the output of integrator 124 and the summing junction 140 on the integrator block 122 with a coefficient block 188 with a coefficient of 0.00098. A second feedback loop is provided from the output of integrator 128 to the negative input of the summing junction 146 through a coefficient block 190, with the coefficient of 0.00413. A third feedback loop is provided between the output of integrator 132 and the negative input of the summing junction 154 and the input of integrator 130 through a coefficient block 192, with a coefficient of 0.02214. A first leap-frog path is provided from the output of integrator 130 to the negative input of the summing junction 150 on the input to the integrator 128 through a coefficient block 194 with a coefficient of 0.00278. A second leap-frog filter path is provided from the output of integrator 126 to the negative input of the summing junction 142 on the input of integrator 124 through a coefficient block 196, with the coefficient of 0.00058.

Figure 8A:
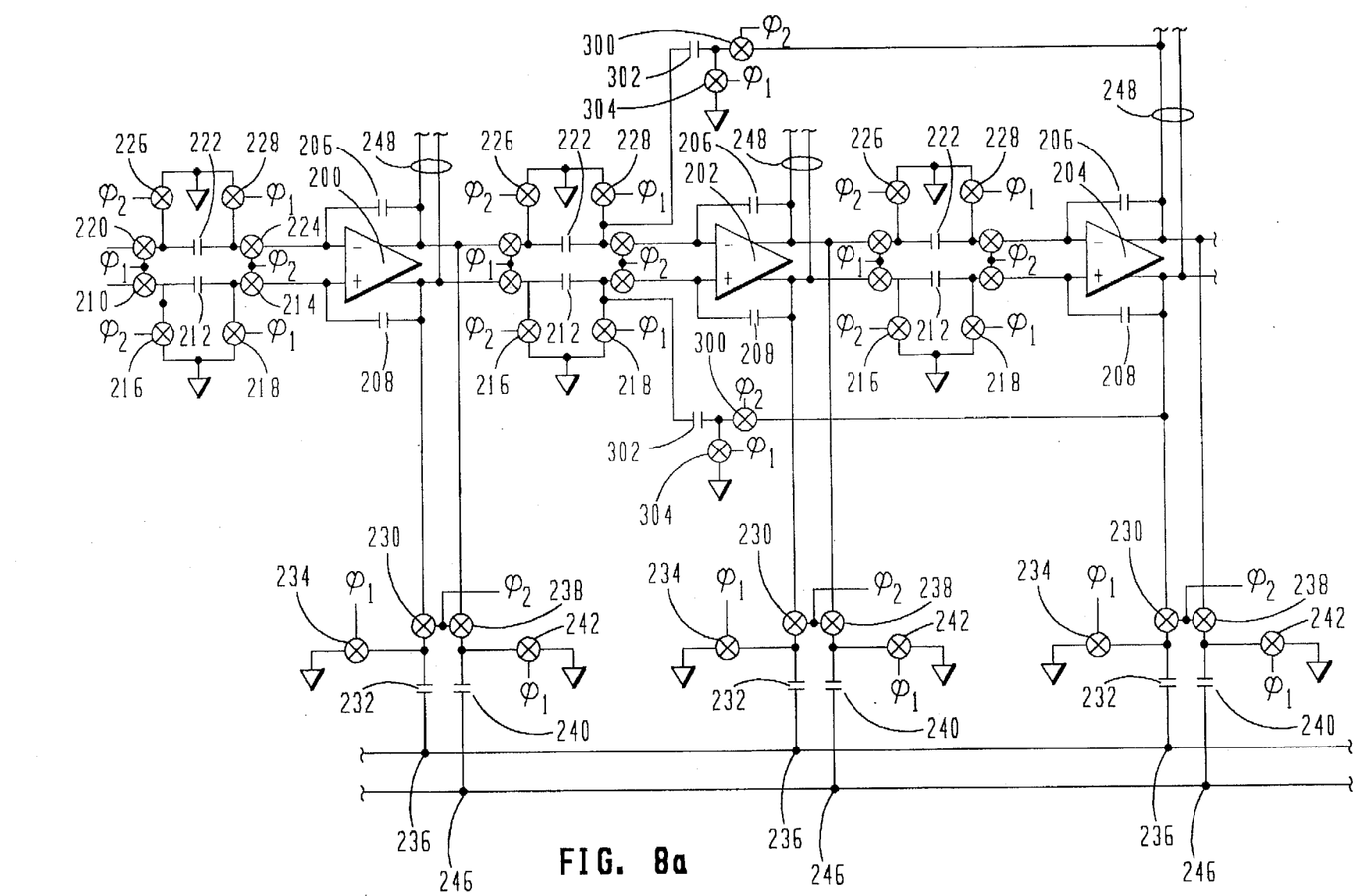
FIGS. 8a and 8b illustrate a detailed logic diagram showing the switched-capacitor configuration.

Referring now to FIG. 8a, there is illustrated a more detailed block diagram illustrating the switched-capacitor configuration with a differential structure. Also illustrated are the first three integrator stages 120, 122 and 124, each comprised of a differential amplifier 200, 202 and 204, respectively. Each of the differential amplifiers 200–204 have associated therewith feedback capacitors 206 and 208. Capacitor 206 is connected between the negative input and the positive output of the respective differential amplifiers 200–204, and the capacitor 208 connected between the positive input and negative output of the respective differential amplifiers 200–204, it being understood that the values are different for each of the capacitors 206 and 208 for each of the differential amplifiers 200–204, respectively.

The positive input to each of the differential amplifiers 200–204 has a switched-capacitor structure associated therewith. This is comprised of a series switch 210, connected between an input node and one side of a capacitor 212, the other side of the capacitor 212 connected to one side of a series switch 214, the output thereof connected to the positive input of the associated amplifiers 200–204. A shunt switch 216 is connected between the one side of the capacitor 212 and ground and associated with the switch 210, and a shunt switch 218 is connected between the other side of the capacitor 212 and ground. Switches 210 and 218 are connected to a timing signal $\phi_2$, and the switches 214 and 216 are connected to the timing signal $\phi_2$, these being out-of-phase, $\phi_1$ and $\phi_2$ being out of phase with each other. Similarly, the negative input of the differential amplifiers 200–204 have a switched-capacitor structure associated therewith that is comprised of a series switch 220, connected between the input thereof and the one side of the capacitor 222, the other side of capacitor 222 connected to one side of a series switch 224, the output thereof connected to the negative input of the associated differential amplifier 200–204. A shunt switch 226 is connected between the output of switch 220 and ground, and a shunt switch 228 is connected between the input of switch 224 and ground. Switches 220 and 228 are connected to the timing signal $\phi_1$ and switches 224 and 226 are connected to the timing signal $\phi_2$. This is a conventional switched-capacitor configuration. The coefficient associated with the input to each of the integrator stages 120–132 in FIG. 7 is determined by the ratio of the capacitor 222 and the feedback capacitor 206.

Each of the positive outputs of the differential amplifiers 200–204 are connected to one side of a series switch 230, the other side thereof connected to one side of the capacitor 232. Also, the other side of the switch 230 is connected to one side of a shunt switch 234, the other side thereof connected to ground. The other side of capacitor 232 is connected to a summing node 236. Similarly, the negative output of amplifiers 200–204 are connected to one side of a series switch 238, the other side thereof connected to one side of a capacitor 240 and one side of a shunt switch 242, the other side of shunt switch 242 connected to ground. The other side of capacitor 240 is connected to a summing node 246. Switches 230 and 238 and are driven by timing signal $\phi_2$ and switches 234 and 242 are driven by timing signal $\phi_1$. These structures associated with the positive and negative outputs of differential amplifiers 200–204 provide the feedback that is associated with the coefficients 160–172 of FIG. 7. These coefficients are determined by the respective one of the capacitors 232 and 240, and the respective feedback capacitors 208 and 206. Additionally, this is a differential structure wherein the positive and negative outputs of differential amplifiers are also connected to another summing node (not shown) via lines 248.

Figure 8B:
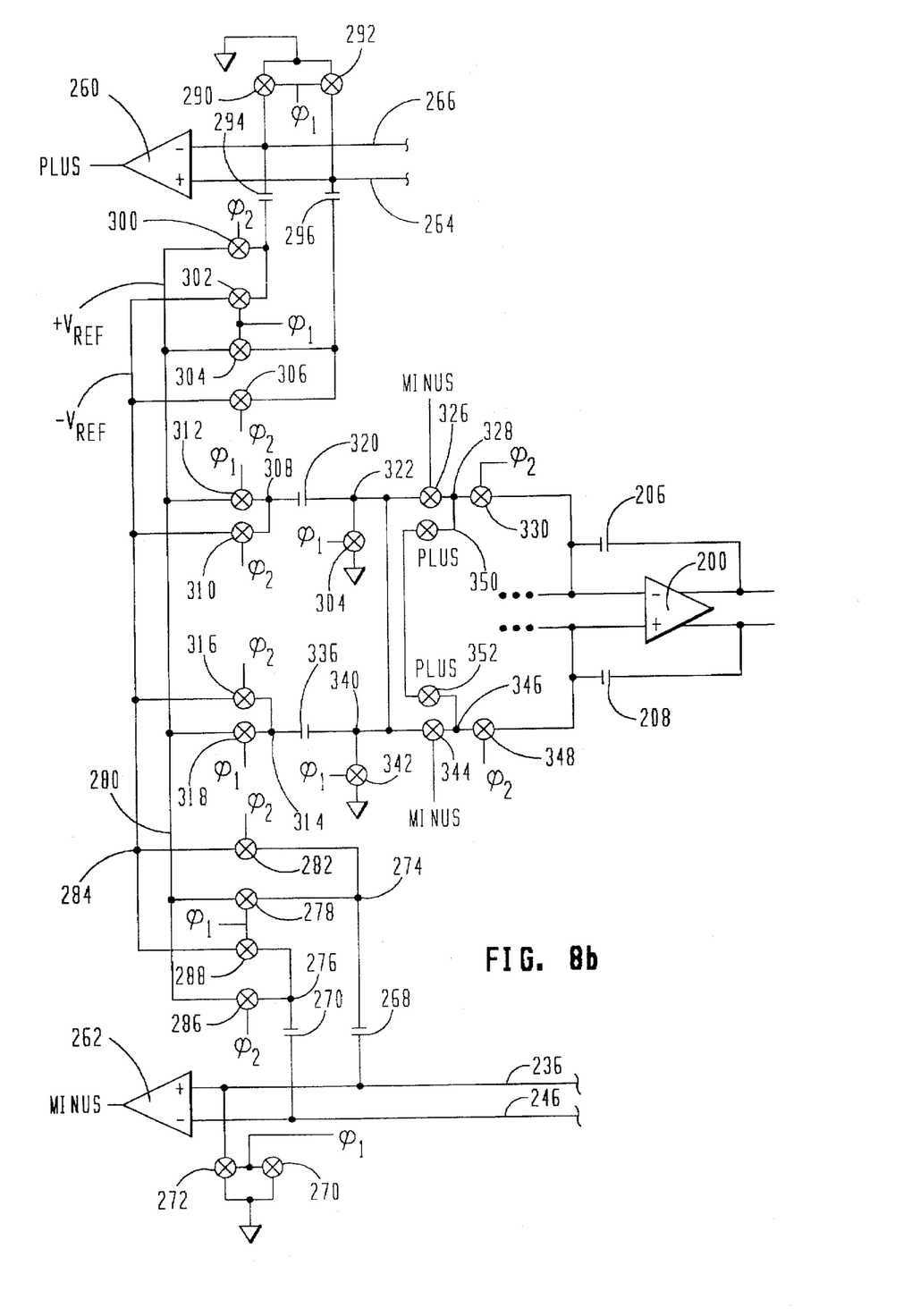

Referring now to FIG. 8b, there is illustrated a detailed block diagram of the feedback structure illustrated in FIG. 7 with respect to the comparator 176 and the DAC 180. The comparator is comprised of two comparators 260 and 262. The comparator 262 is associated with the summing nodes 236 and 246, with summing node 236 input to the positive input of the comparator 262 and the summing node 246 input to the negative node of comparator 262. There are two similar summing nodes 264 and 266 associated with the comparator 260, summing node 266 input to the negative input of comparator 260 and summing node 264 to input to the positive input thereof. Comparator 260 and the summing nodes 266 and 264 are associated with the corresponding upper portion of the differential structure of FIG. 8a associated with lines 248.

Summing node 236 is connected to one plate of a capacitor 268 and summing node 246 is connected to one plate of a capacitor 270. Summing nodes 246 and 236 are connected to ground through switches 271 and 272, respectively, switches 271 and 272 controlled by the signal $\phi_1$.

The other plate of capacitor 268 is connected to a node 274 and the other plate of capacitor 270 is connected to a node 276. Node 274 is connected through a switch 278 to a node 280 which is labeled $+V_{REF}$ and through a switch 282 to a node 284 labeled $-V_{REF}$. Similarly, node 276 is connected through a switch 286 to node 280 and through a switch 288 to node 284. Switches 278 are controlled by the signal $\phi_1$ and switches 282 and 286 are controlled by the signal $\phi_2$.

The summing nodes 266 and 264 are connected to ground through switches 290 and 292, respectively, switches 290 and 292 controlled by the $\phi_1$ signal. Summing node 266 is connected to one side of a capacitor 294 and summing node 264 is connected to one side of a capacitor 296. The other side of capacitor 294 is connected to the node 280 through a switch 300 and to the node 284 through a switch 302. The other plate of capacitor 296 is connected through a switch 304 to node 280 and through a switch 306 to node 284. Switches 302 and 304 are controlled by the signal $\phi_1$ and switches 300 and 306 are controlled by the signal $\phi_2$.

Node 280 is connected to a node 308 through a switch 312 and node 284 is connected through a switch 310 to the node 308. Switch 312 is controlled by the signal $\phi_1$ and switch 310 is controlled by this signal $\phi_2$. Similarly, node 280 is connected to a node 314 through a switch 316 and node 284 is connected to the node 314 through a switch 318, switch 316 controlled by the signal $\phi_2$ and switch 318 controlled by the signal $\phi_1$. Node 308 is connected to one side of a capacitor 320, the other side thereof connected to a node 322. Node 322 is connected to ground through a switch 324, which is controlled by the signal $\phi_1$. Node 322 is also connected through a switch 326 to a node 328, switch 326 controlled by a signal MINUS, which is generated on the output of comparator 262. Node 328 is connected through a switch 330 to the negative input of the differential amplifier 200, switch 330 controlled by the $\phi_2$ signal.

Node 314 is connected to one side of a capacitor 336, the other side thereof connected to a node 340, node 340 connected to ground through a switch 342, which is controlled by a signal $\phi_1$. Node 340 is also connected through a switch 344 to a node 346, switch 344 controlled by the MINUS signal. Node 346 is connected through a switch 348 to the positive input of the differential amplifier 200. Additionally, node 328 is connected through a switch 350 to node 340, switch 350 controlled by a signal PLUS, which is generated on the output of the comparator 260. Similarly, node 346 is connected through a switch 352 to node 322, switch 352 controlled by the PLUS signal.

Referring now to FIG. 9, there is illustrated a detailed schematic diagram of select ones of the switched capacitors that have a very small value. It should be appreciated that difficulties exists when trying to manufacture capacitors of extremely small sizes to realize the small coefficients utilized in the leap-frog filter configuration of the present invention. In order to fabricate such capacitors, a "T-shape" capacitor configuration is utilized. In FIG. 9, this is illustrated as two series connected capacitors labelled $C_1$ with a shunt capacitor $C_2$ disposed between ground and the junction between the two capacitors $C_1$. This will result in an overall capacitor according to the following relationship:

$$\frac{C_1^2}{(2C_1+C_2)}$$

It can therefore be seen that much larger capacitors can be utilized to realize a very small value with this configuration.

In summary, there has been provided an analog modulator that is comprised of a high order switched-capacitor integrator structure. A plurality of switched-capacitor integrators are provided that are disposed in series. Primary feedback switched-capacitor circuits are provided to define the zeroes of the passband response in a equi-ripple design. These primary feedback structures are connected from the output of one integrator to one input of the preceding integrator in the serial configuration. The zeroes are stabilized with a leap-frog configuration wherein a leap-frog feedback structure is disposed between the output of the integrator having the primary feedback circuit connected to the input thereof and the other side of the leap-frog feedback structure connected to the input of a preceding integrator. The coefficients for the leap-frog feedback structure desensitize the movement of zeroes in the passband with respect to the coefficients of the primary feedback structures that define the zeroes. The output of each of the integrators is input to a feedback network in a tapped filter design, these outputs being defined by associated filter coefficients and utilizing a switched-capacitor structure. The output of each of these feedback structures is summed and input to a comparator, the output thereof input to a quantizing circuit. The quantizing circuit output is fed back for summation with the input signal for input to the first integrator.

Although the preferred embodiment has been described in detail, it should be understood that various changes, substitutions and alterations can be made therein without departing from the spirit and scope of the invention as defined by the appended claims.

What is claimed is:

1. An oversampled analog modulator, comprising:
   a plurality of switched-capacitor integrators connected in series;
   a plurality of pole-defining switched-capacitor feedback structures each associated with one of said switched-capacitor integrators and having one side thereof connected to the output of said associated switched-capacitor integrator;
   a first summing junction connected to the other side of each of said plurality of pole-defining switched-capacitor feedback structures for summing the output thereof;
   a quantization circuit for quantizing the output of said first summing junction to provide the digital output of the analog modulator;
   a second summing junction for summing the output of said quantization circuit with an analog input signal to provide the input to the first of said switched-capacitor integrators;
   at least one primary switched-capacitor feedback structure for defining zeros in the passband of the analog modulator and connected between the output of one of said switched-capacitor integrators and the input of the preceding and adjacent one of said switched-capacitor integrators; and at least one leap-frog switched-capacitor feedback structure connected between the output of the one of said switched-capacitor integrators having the input thereof connected to the output of said at least one primary switched-capacitor feedback structure and the input of the preceding one of said switched-capacitor integrators.

2. The analog modulator of claim 1, wherein said primary switched-capacitor feedback structure and said leap-frog feedback structure comprise:

a plurality of primary switched-capacitor feedback structures connected across sequential adjacent pairs of said switched-capacitor integrators, said primary switched-capacitor feedback structures each having a coefficient associated therewith, the coefficients of said primary switched-capacitor feedback structures defining the position of the zeroes in the passband of analog response of the analog modulator; and a plurality of leap-frog switched-capacitor structures numbering one less than the number of said primary switched-capacitor feedback structures and each connected between adjacent pairs of said switched-capacitor integrator structures.

3. The analog modulator of claim 2, wherein the passband response of the analog modulator is an equi-ripple passband response.

4. The analog modulator of claim 1, wherein said quantization circuit comprises a comparator for generating an output having at least two logic states and a switched-capacitor digital-to-analog converter for converting the output of said comparator to an analog signal for input to said second summing junction.

5. The analog modulator of claim 1, wherein the digital output of said quantization circuit comprises a multi-level quantization output.

6. The analog modulator of claim 1, wherein said analog modulator comprises a seventh order analog modulator.

7. The analog modulator of claim 1, wherein the analog modulator is of an odd order.

8. An oversampled analog modulator, comprising:

a plurality of switched-capacitor integrators connected in series and having a number Z of said switched-capacitor integrators;

a quantized feedback structure connected between the output of each of said switched-capacitor integrators and the input of the analog modulator in a summation configuration; and a leap-frog feedback filter structure having:

at least one switched-capacitor feedback loop connected from the output of the Mth one of said switched-capacitor integrators to the input of the Nth one of said switched-capacitor integrators, the value of M less than or equal to the value of Z and the value of N less than the value of M, and M, N and Z being integers, and at least one switched-capacitor leap-frog filter loop connected between the output of the Ith one of said switched-capacitor integrators and the input of the Kth one of said switched-capacitor integrators, I and K being integers, with I less than M and greater than or equal to N, and K less than N.

9. The analog modulator of claim 8, wherein said quantizing feedback structure comprises:

a plurality of pole-defining switched-capacitor feedback structures, each associated with one of said switched-capacitor integrators and having one side thereof connected to the output of said associated switched-capacitor integrators;

a first summing junction connected to the other side of each of said plurality of said pole-defining switched-capacitor feedback structures for summing the output thereof;

a quantization circuit for quantizing the output of said first summing junction to provide the digital output of the analog modulator;

a data conversion device for converting the digital output of said quantization circuit to an analog signal; and a second summing junction for summing the output of said data conversion circuit with an analog input signal to provide the input to the first of said switched-capacitor integrators.

10. The analog modulator of claim 9, wherein said quantization circuit comprises a comparator for generating an output having at least two logic states and a data conversion device comprising a switched-capacitor digital-to-analog converter for converting the output of said comparator to an analog signal for input to said second summing junction.

11. The analog modulator of claim 12, wherein said primary switched-capacitor feedback structure and said leap-frog feedback structure comprise:

a plurality of primary switched-capacitor feedback structures connected across sequential adjacent pairs of said switched-capacitor integrators, said primary switched-capacitor feedback structures each having a coefficient associated therewith, the coefficients of said primary switched-capacitor feedback structures defining the position of the zeroes in the passband of the analog response of the analog modulator; and a plurality of leap-frog switched-capacitor structures numbering one less than the number of said primary switched-capacitor feedback structures and each connected between adjacent pairs of said switched-capacitor integrator structures, the input of the one of said leap-frog feedback structures connected between the two of said switched-capacitor integrators associated with the highest order one of said primary feedback structures.

12. The analog modulator of claim 8, wherein the value of N is equal to M−1.

13. The analog modulator of claim 8, wherein the value of N is equal to the value of I.

14. The analog modulator of claim 8, wherein the value of K is equal to N−1.

15. A method for converting an analog input signal to a digital output signal, comprising the steps of:

providing a plurality of switched-capacitor integrators, there being Z switched-capacitor integrators, Z being an integer;

connecting the switched-capacitor integrators in a series configuration;

feeding back each of the outputs of the switched-capacitor integrators through a weighted coefficient to the input of the first of the switched-capacitor integrators in the series and summing the feedback signal with the analog input signal and the step of feeding back operable to quantize with the feedback signal through a quantization structure to provide the digital output signal, which digital output signal is then converted to an analog signal for summing with the analog input signal;

feeding back the output of the Mth one of the switched-capacitor integrators to the input of the Nth one of the switched-capacitor integrators through a primary feedback structure, N and M being integers with M less than or equal to the value of Z and N less than M; and feeding back the output of the Ith one of the switched-capacitor integrators to the input of the Kth one of the switched-capacitor integrators through a leap-frog field feedback structure, I and K being integers with I less than M and greater than or equal to N, and K less than N.

16. The method of claim 15, wherein the value of N is equal to M−1.

17. The method of claim 15, wherein the value of M is equal to I.

18. The method of claim 15, wherein the value of K is equal to M−1.

* * * * *